US009209271B1

(12) United States Patent
Lee et al.

(10) Patent No.: US 9,209,271 B1
(45) Date of Patent: Dec. 8, 2015

(54) VERTICAL III-V NANOWIRE FIELD-EFFECT TRANSISTOR USING NANOSPHERE LITHOGRAPHY

(71) Applicant: Board of Regents, The University of Texas System, Austin, TX (US)

(72) Inventors: Jack C. Lee, Austin, TX (US); Fei Xue, Austin, TX (US)

(73) Assignee: Board of Regents, The University of Texas System, Austin, TX (US)

( * ) Notice: Subject to any disclaimer, the term of this patent is extended or adjusted under 35 U.S.C. 154(b) by 0 days.

(21) Appl. No.: 14/837,258

(22) Filed: Aug. 27, 2015

Related U.S. Application Data

(62) Division of application No. 13/973,045, filed on Aug. 22, 2013.

(51) Int. Cl.
| | |
|---|---|
| H01L 21/336 | (2006.01) |
| H01L 29/66 | (2006.01) |
| H01L 21/02 | (2006.01) |
| H01L 21/283 | (2006.01) |
| H01L 21/306 | (2006.01) |
| H01L 29/06 | (2006.01) |

(52) U.S. Cl.
CPC .... *H01L 29/66522* (2013.01); *H01L 21/02538* (2013.01); *H01L 21/02603* (2013.01); *H01L 21/283* (2013.01); *H01L 21/30604* (2013.01); *H01L 29/0676* (2013.01); *H01L 29/66666* (2013.01)

(58) Field of Classification Search
CPC .................. H01L 21/823487; H01L 21/02603; H01L 29/0669; H01L 29/676
USPC .................................. 438/156, 212; 257/210
See application file for complete search history.

(56) References Cited

U.S. PATENT DOCUMENTS

| | | | | | |
|---|---|---|---|---|---|
| 4,407,695 | A | * | 10/1983 | Deckman | ................. B41M 5/24 204/192.34 |
| 5,676,853 | A | * | 10/1997 | Alwan | ..................... G03F 1/14 216/11 |

(Continued)

OTHER PUBLICATIONS

Tomioka et al., "A III-V Nanowire Channel on Silicon for High-Performance Vertical Transistors," Nature, vol. 488, 2012, pp. 189-193.

(Continued)

*Primary Examiner* — Earl Taylor
(74) *Attorney, Agent, or Firm* — Robert A. Voigt, Jr.; Winstead, P.C.

(57) ABSTRACT

A vertical III-V nanowire Field-Effect Transistor (FET). The FET includes multiple nanowires or nanopillars directly connected to a drain contact, where each of the nanopillars includes a channel of undoped III-V semiconductor material. The FET further includes a gate dielectric layer surrounding the plurality of nanopillars and a gate contact disposed on a gate metal which is connected to the gate dielectric layer. Additionally, the FET includes a substrate of doped III-V semiconductor material connected to the nanopillars via a layer of doped III-V semiconductor material. In addition, the FET contains a source contact directly connected to the bottom of the substrate. By having such a structure, electrostatic control and integration density is improved. Furthermore, by using III-V materials as opposed to silicon, the current drive capacity is improved. Additionally, the FET is fabricated using nanosphere lithography which is less costly than the conventional photo lithography process.

10 Claims, 7 Drawing Sheets

(56) References Cited

U.S. PATENT DOCUMENTS

| | | | | |
|---|---|---|---|---|
| 6,428,943 | B1* | 8/2002 | Wells | G03F 1/14 430/313 |
| 6,437,390 | B1* | 8/2002 | Thapar | H01L 29/7827 257/302 |
| 7,230,286 | B2* | 6/2007 | Cohen | B82Y 10/00 257/210 |
| 7,446,025 | B2* | 11/2008 | Cohen | B82Y 10/00 257/E21.131 |
| 8,178,403 | B2* | 5/2012 | Ohlsson | B82Y 10/00 257/262 |
| 8,551,834 | B2* | 10/2013 | Ohlsson | B82Y 10/00 257/329 |
| 8,890,119 | B2* | 11/2014 | Doyle | H01L 29/66666 257/24 |
| 2002/0036318 | A1* | 3/2002 | Thapar | H01L 29/7827 257/320 |
| 2006/0273389 | A1* | 12/2006 | Cohen | B82Y 10/00 257/331 |
| 2008/0293246 | A1* | 11/2008 | Cohen | B82Y 10/00 438/682 |
| 2010/0080954 | A1* | 4/2010 | Mohseni | G03F 7/20 428/131 |
| 2010/0102380 | A1* | 4/2010 | Ohlsson | B82Y 10/00 257/329 |
| 2010/0175749 | A1* | 7/2010 | Tsutsumi | H01L 31/022433 136/256 |
| 2011/0253982 | A1* | 10/2011 | Wang | B82Y 10/00 257/24 |
| 2012/0145990 | A1* | 6/2012 | Samuelson | B81C 1/00111 257/13 |
| 2012/0211727 | A1* | 8/2012 | Ohlsson | B82Y 10/00 257/29 |
| 2013/0240983 | A1* | 9/2013 | Larrieu | B82Y 10/00 257/329 |
| 2013/0307513 | A1* | 11/2013 | Then | H01L 29/66469 323/311 |
| 2014/0008606 | A1* | 1/2014 | Hussain | H01L 29/0676 257/9 |
| 2014/0103423 | A1* | 4/2014 | Ohlsson | B82Y 10/00 257/329 |
| 2014/0166092 | A1* | 6/2014 | Kozinsky | H01L 31/02366 136/256 |
| 2014/0166981 | A1* | 6/2014 | Doyle | H01L 29/66666 257/24 |
| 2014/0209864 | A1* | 7/2014 | Bangsaruntip | H01L 21/77 257/29 |
| 2015/0053929 | A1* | 2/2015 | Lee | H01L 29/775 257/29 |

OTHER PUBLICATIONS

Gu et al., "20-80nm Channel Length InGaAs Gate-all-around Nanowire MOSFETs with EOT =1.2nm and Lowest SS=63mV/dec," IEEE, IEDM12, 2012, pp. 633-636.

Thelander et al., "Development of a Vertical Wrap-Gated InAs FET," IEEE Transactions on Electron Devices, vol. 55, No. 11, Nov. 2008, pp. 3030-3036.

Larrieu et al., "Vertical Nanowire Array-Based Field Effect Transistors for Ultimate Scaling," Nanoscale, vol. 5, 2013, pp. 2437-2441.

Goldberger et al., "Silicon Vertically Integrated Nanowire Field Effect Transistors," Nano Letters, vol. 6, No. 5, 2006, pp. 973-977.

Bryllert et al., "Vertical High-Mobility Wrap-Gated InAs Nanowire Transistor," vol. 27, No. 5, 2006, pp. 323-325.

* cited by examiner

VERTICAL III-V NANOWIRE FIELD-EFFECT TRANSISTOR USING NANOSPHERE LITHOGRAPHY

TECHNICAL FIELD

The present invention relates generally to Complementary Metal-Oxide-Semiconductor (CMOS) devices, and more particularly to a vertical III-V nanowire Field-Effect Transistor (FET) that uses nanosphere lithography in fabricating such a device, where such a structure and process improve electron mobility and electrostatic control as well as increase integration density and reduce power consumption and cost of fabrication.

BACKGROUND

Complementary Metal-Oxide-Semiconductor (CMOS) devices are being scaled down aggressively in each technology generation to achieve higher integration density. However, the scaling of CMOS devices is approaching its physical limitations. For example, one significant factor limiting MOS scaling is off-state power consumption. Within digital logic, the sources that contribute to off-state power consumption include junction leakage, gate induced drain leakage, sub-threshold channel current, and gate tunnel currents. These become increasingly significant as the dimensions decrease. For instance, when the length of the channel (the channel can be visualized as the "stream" through which charges (e.g., electrons, holes) flow from the source to the drain of the transistor) in the CMOS device becomes so short, such as on the order of 20 nm, the transistor is unable to be turned off because of undesirable leakage current between the source and the drain. As a result, new materials and device structures are needed to enable further performance improvements.

BRIEF SUMMARY

In one embodiment of the present invention, a semiconductor device comprises a drain contact. The semiconductor device further comprises a plurality of nanopillars directly connected to the drain contact, where each of the plurality of nanopillars comprises a channel of the semiconductor device. Furthermore, each of the plurality of channels comprises undoped III-V semiconductor material. The semiconductor device additionally comprises a gate dielectric layer surrounding the plurality of nanopillars. Additionally, the semiconductor device comprises a gate contact connected to a gate metal layer which is connected to the gate dielectric layer. The semiconductor device further comprises a substrate connected to the plurality of nanopillars via a first layer of doped III-V semiconductor material, where the gate metal layer is isolated from the first layer of doped III-V semiconductor material by the gate dielectric layer. In addition, the semiconductor device comprises a source contact directly connected to the substrate.

In another embodiment of the present invention, a method for fabricating a vertical III-V nanowire field-effect transistor comprises depositing a first layer of doped III-V semiconductor material on a substrate of III-V semiconductor material. The method further comprises depositing a layer of undoped III-V semiconductor material on top of the first layer of doped III-V semiconductor material. Additionally, the method comprises depositing a second layer of doped III-V semiconductor material on top of the layer of undoped III-V semiconductor material. Furthermore, the method comprises growing a first dielectric layer on top of the second layer of doped III-V semiconductor material. The method additionally comprises depositing self-assembled monolayers of nanospheres on the first dielectric layer. In addition, the method comprises forming nanopillars using the nanospheres as a mask and the first dielectric layer as a hard mask to etch the second layer of doped III-V semiconductor material and the layer of undoped III-V semiconductor material using nanosphere lithography.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE DRAWINGS

A better understanding of the present invention can be obtained when the following detailed description is considered in conjunction with the following drawings, in which:

FIGS. 2A-2I depict cross-sectional views of the FET during the fabrication steps described in FIG. 1 in accordance with an embodiment of the present invention.

DETAILED DESCRIPTION

As discussed in the Background section, Complementary Metal-Oxide-Semiconductor (CMOS) devices are being scaled down aggressively in each technology generation to achieve higher integration density. However, the scaling of CMOS devices is approaching its physical limitations. For example, one significant factor limiting MOS scaling is off-state power consumption. Within digital logic, the sources that contribute to off-state power consumption include junction leakage, gate induced drain leakage, subthreshold channel current, and gate tunnel currents. These become increasingly significant as the dimensions decrease. For instance, when the length of the channel in the CMOS device becomes so short, such as on the order of 20 nm, the transistor is unable to be turned off because of undesirable leakage current between the source and the drain. The channel can be visualized as the "stream" through which electrons or holes flow from the source to the drain of the n-channel and p-channel transistor, respectively. As a result, new materials and device structures are needed to enable further performance improvements.

Figure 1A:
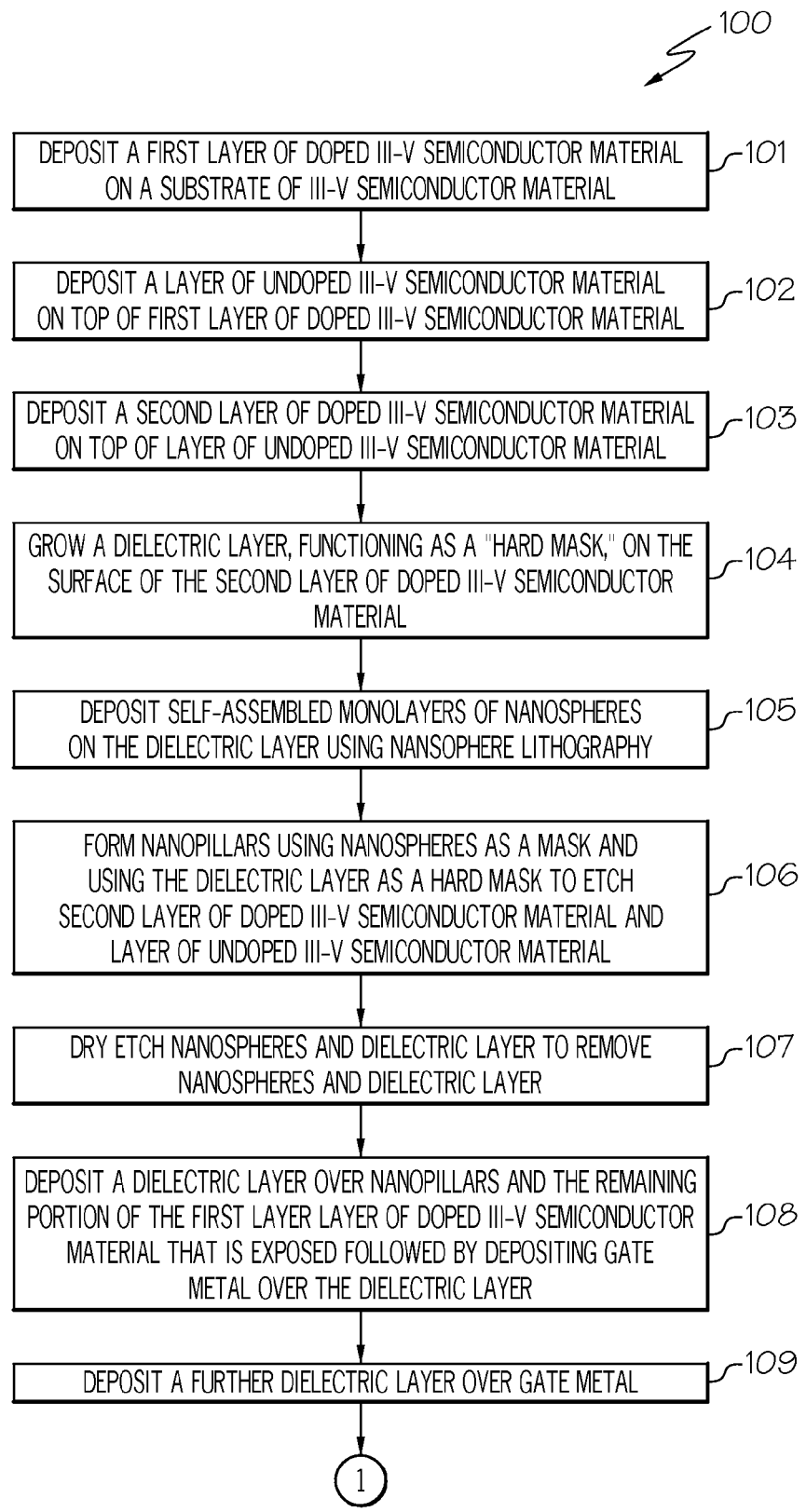
FIGS. 1A-1B are a flowchart of a method for fabricating a vertical III-V nanowire Field-Effect Transistor (FET) using nanosphere lithography in accordance with an embodiment of the present invention.
Figure 1B:
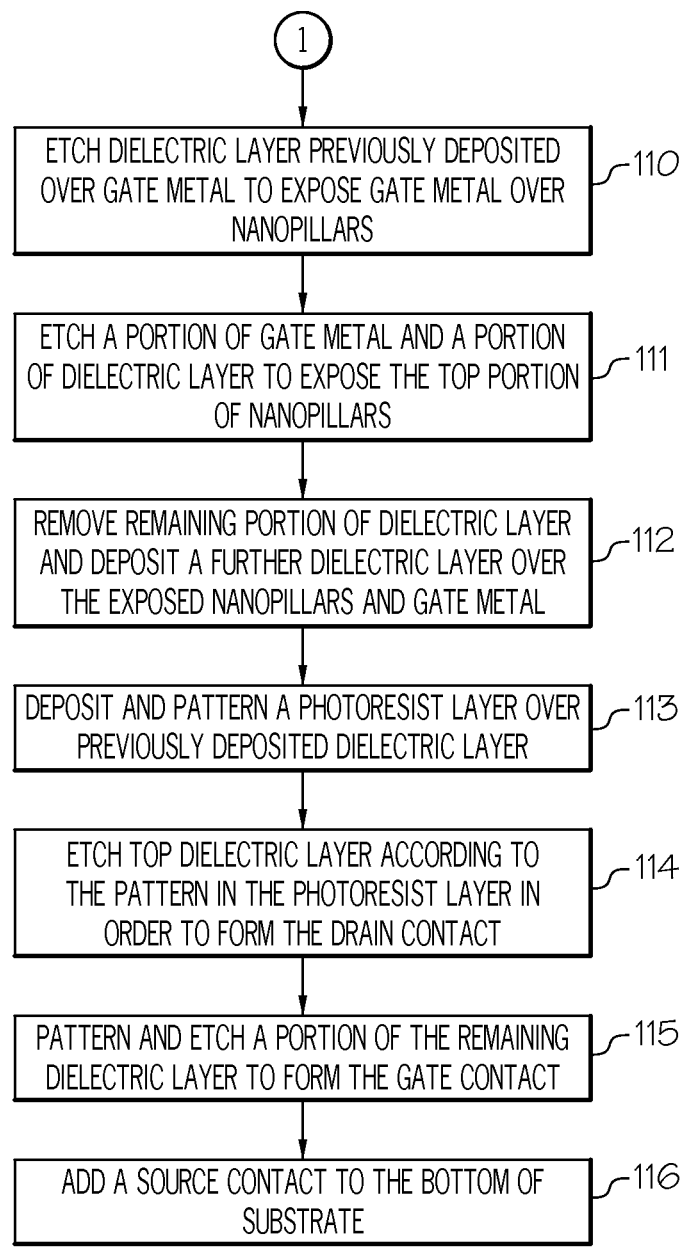

The principles of the present invention provide a process and structure for a novel vertical III-V nanowire Field-Effect Transistor (FET) that uses nanosphere lithography in fabricating such a device that results in improving the electron mobility and electrostatic control as well as increasing the integration density and reducing the power consumption and cost of fabrication as discussed below in connection with FIGS. 1A-1B and 2A-2I. FIGS. 1A-1B are a flowchart of a method for fabricating such a vertical III-V nanowire FET. FIGS. 2A-2I depict the cross-sectional views of the vertical III-V nanowire FET during the fabrication steps described in FIG. 1.

Referring to FIGS. 1A-1B, FIGS. 1A-1B are a flowchart of a method 100 for fabricating a vertical III-V nanowire FET using nanosphere lithography in accordance with an embodiment of the present invention. FIGS. 1A-1B will be discussed in conjunction with FIGS. 2A-2I, which depict the cross-sectional views of FET 200 during the fabrication steps described in FIGS. 1A-1B in accordance with an embodiment of the present invention.

Figure 2A:
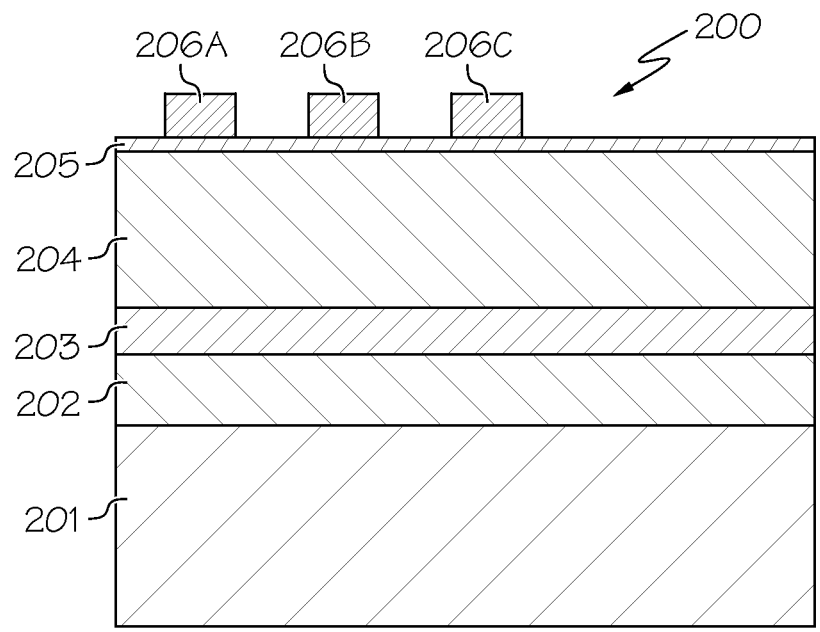
Figure 2B:
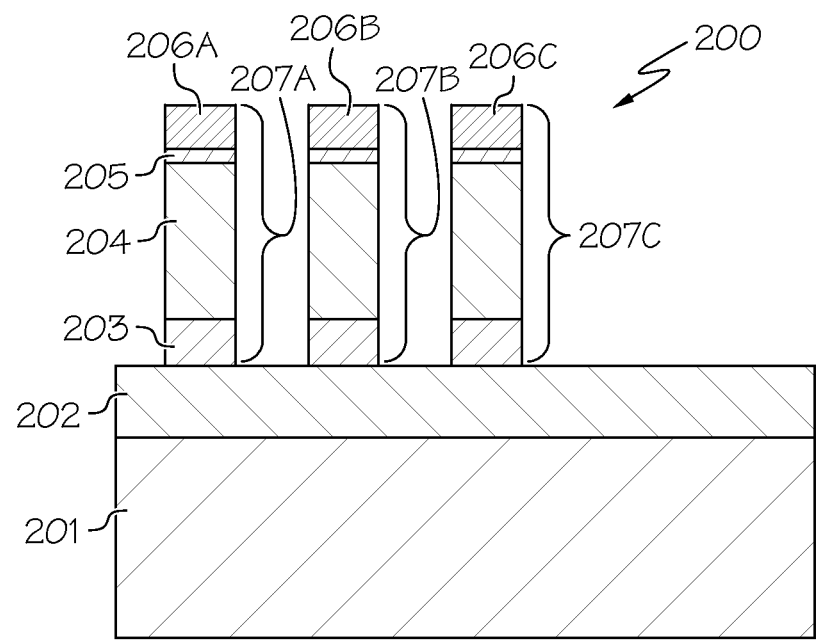
Figure 2C:
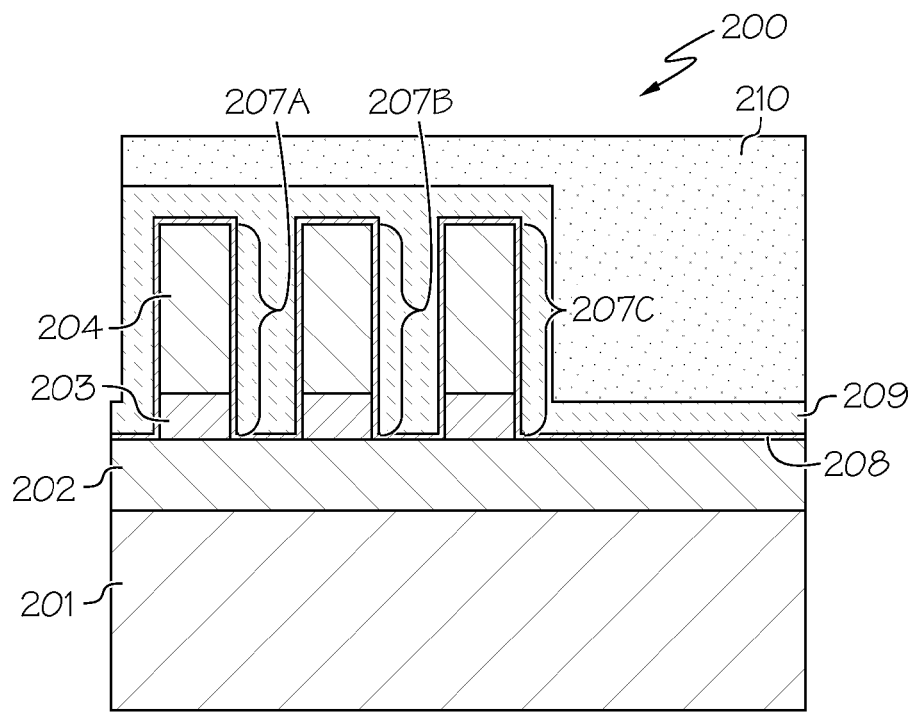

Referring now to FIG. 1A, in conjunction with FIGS. 2A-2C, in step 101, a first layer 202 of doped III-V semiconductor material (e.g., indium gallium arsenide (InGaAs)) is deposited on top of substrate 201 of doped III-V semiconductor material (e.g., indium phosphide (InP)) as illustrated in FIG. 2A. In one embodiment, layer 202 is heavily doped for n-type doping (e.g., n+InGaAs). In one embodiment, substrate 201 is heavily doped for n-type doping (e.g., n+InP).

In step 102, a layer of undoped III-V semiconductor material 203 (e.g., InGaAs) is deposited on top of layer 202 as shown in FIG. 2A. In one embodiment, layer 203 corresponds to the material that will form the multiple vertical channels used in a bundle of nanowires or "nanopillars" as discussed further below. The vertical length (i.e., the thickness) of layer 203 determines the length of these channels. By using III-V semiconductor material for the channels, electron mobility is improved in comparison to using silicon.

In step 103, a second layer of doped III-V semiconductor material 204 (e.g., indium gallium arsenide (InGaAs)) is deposited on top of layer 203 as shown in FIG. 2A. In one embodiment, layer 204 is heavily doped for n-type doping (e.g., n+InGaAs).

In step 104, a dielectric layer 205, functioning as a "hard mask" material, such as silicon dioxide, is grown on the surface of layer 204 as shown in FIG. 2A. As will be discussed below, a pattern of nanospheres will be transferred to dielectric layer 205 which will be used as a "hard" mask to form nanopillars.

In step 105, self-assembled monolayers of nanospheres 206A-206C (e.g., spheres of polystyrene) are deposited on layer 205 using nanosphere lithography, where nanospheres 206A-206C are used as masks as shown in FIG. 2A. By using nanosphere lithography, as opposed to conventional photo lithography, the mask of conventional photo lithography is no longer needed thereby reducing the cost in fabricating semiconductor device 200. Nanospheres 206A-206C may collectively or individually be referred to as nanospheres 206 or nanosphere 206, respectively. While FIG. 2A illustrates the use of three nanospheres 206 to form three nanopillars (as discussed below), the principles of the present invention are not to be limited to forming any particular number of nanopillars. The diameter of the nanospheres 206 may then be further controlled via oxidation (e.g., oxygen plasma).

In step 106, nanospheres 206 are then used as a mask and dielectric layer 205 is used as a hard mask to etch layers 204-205 in a manner to form a bundle of nanowires or "nanopillars" 207A-207C as shown in FIG. 2B. Nanopillars 207A-207C may collectively or individually be referred to as nanopillars 207 or nanopillar 207, respectively. In one embodiment, a dry etch is used to form nanopillars 207. The perimeter of nanopillars 207 controls the diameter of the channels 203 of nanopillars 207. In one embodiment, the diameter of channels 203 in nanopillars 207 is approximately 150 nm. In one embodiment, the length (i.e., the vertical thickness) of channels 203 in nanopillars 207 is between 50 nm and 200 nm.

In step 107, nanospheres 206 and dielectric layer 205 are dry etched to remove nanospheres 206 and dielectric layer 205 as illustrated in FIG. 2C. In step 108, a dielectric layer 208 (e.g., aluminum oxide ($Al_2O_3$) or hafnium oxide ($HfO_2$)) is deposited over nanopillars 207 and the remaining portion of layer 202 that is exposed (exposed following the dry etch of step 107) followed by depositing gate metal 209 (e.g., titanium nitride (TiN)) over dielectric layer 208 as illustrated in FIG. 2C. In one embodiment, dielectric layer 208 is deposited using atomic layer deposition. In one embodiment, dielectric layer 208 serves as the gate dielectric layer for transistor 200. In one embodiment, gate metal 209 is isolated from the first layer 202 of doped III-V semiconductor material by gate dielectric layer 208 as shown in FIG. 2C.

In step 109, a further dielectric layer 210 is deposited over gate metal 209 as illustrated in FIG. 2C.

Figure 2D:
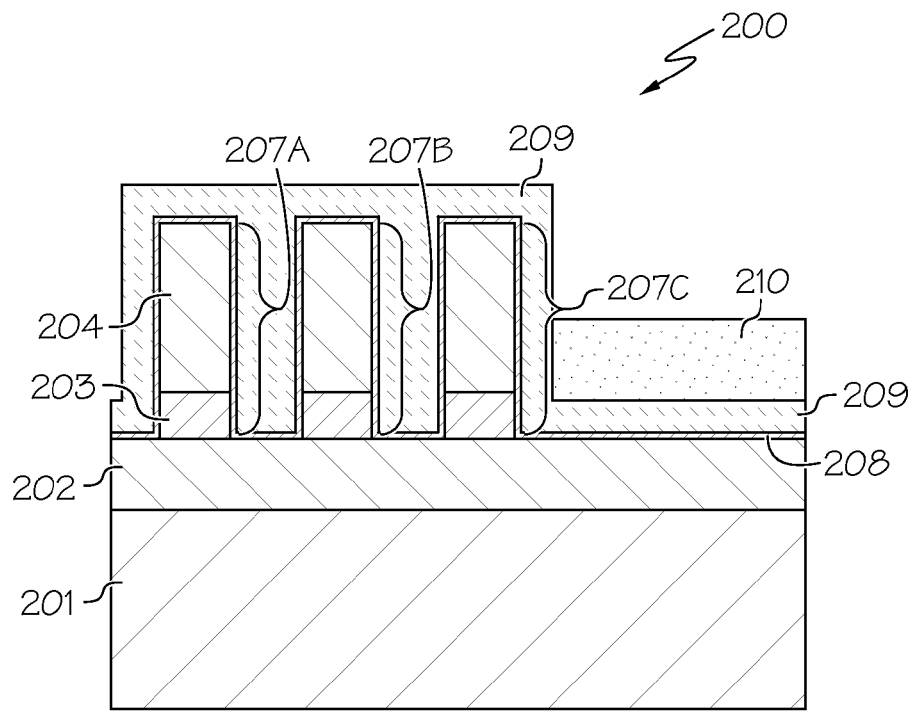

Referring now to FIG. 1B, in conjunction with FIGS. 2D-2I, In step 110, dielectric layer 210 is etched to expose gate metal 209 over nanopillars 207 as shown in FIG. 2D.

Figure 2E:
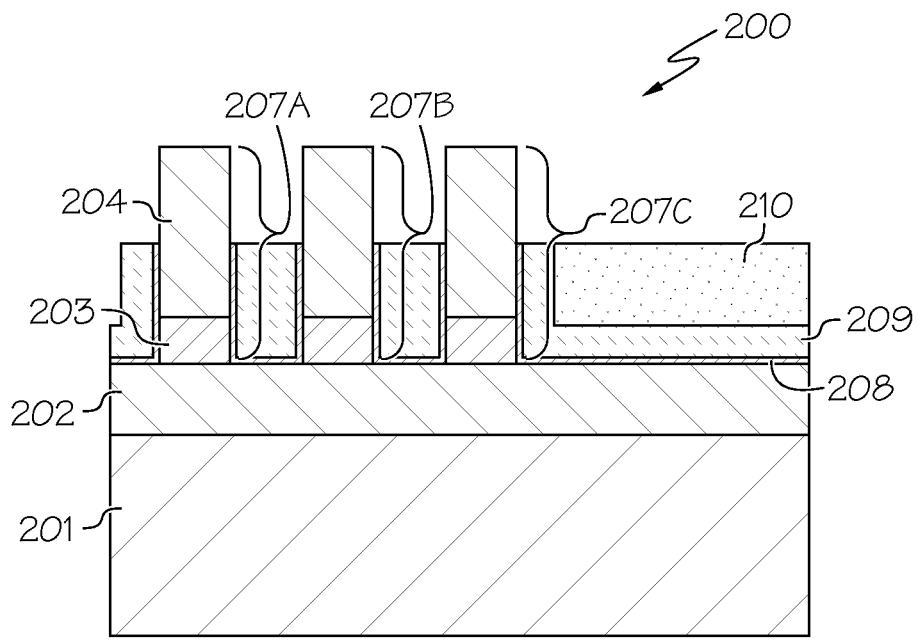

In step 111, a portion of gate metal 209 and a portion of dielectric layer 208 are etched to expose the top portion of nanopillars 207 as shown in FIG. 2E.

Figure 2F:
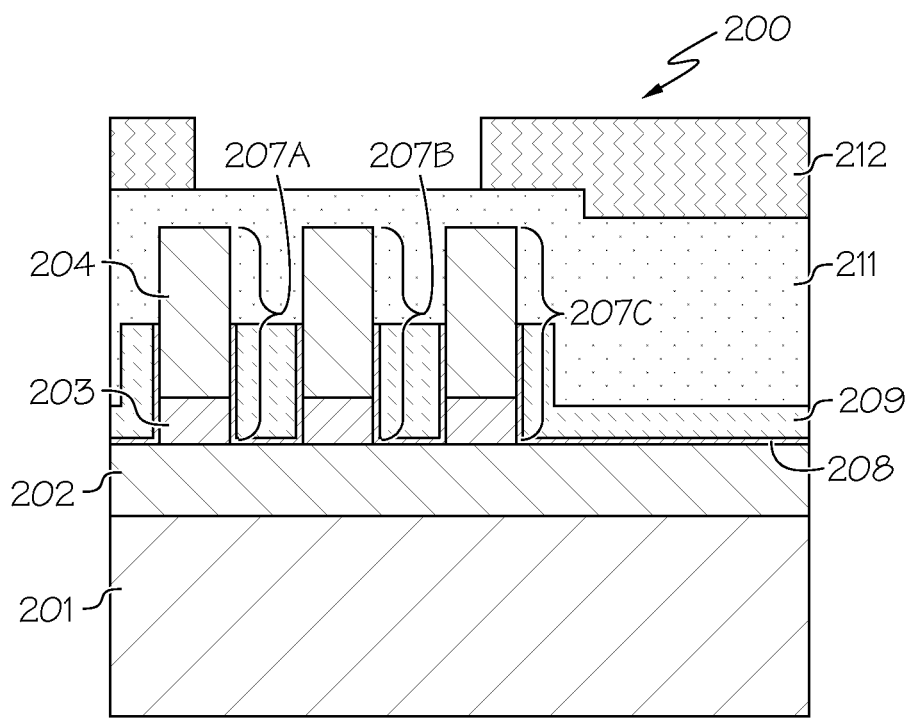

In step 112, the remaining portion of dielectric layer 210 is removed to expose a portion of gate metal 209 and dielectric layer 211 is deposited over the exposed nanopillars 207 and the exposed gate metal 209 as shown in FIG. 2F.

In step 113, a photoresist layer 212 is deposited and patterned over dielectric layer 211 in a manner as shown in FIG. 2F. In one embodiment, photoresist layer 212 is patterned by lithography to open the drain area.

Figure 2G:
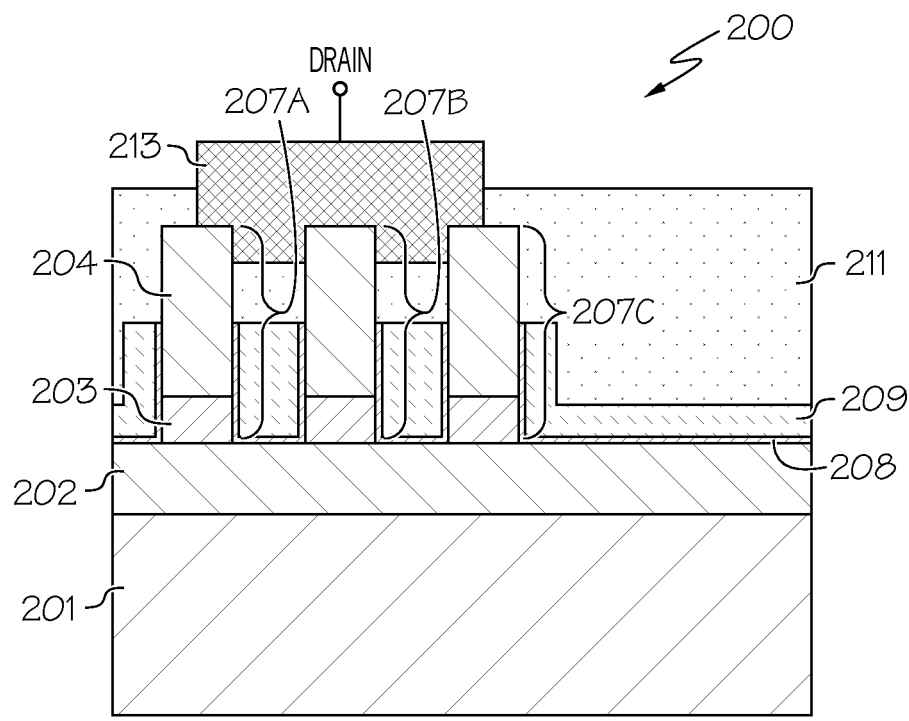

In step 114, dielectric layer 211 is etched according to the pattern in photoresist layer 212 in order to form the drain contact 213 as shown in FIG. 2G. Drain contact 213 is directly connected to nanopillars 207. In one embodiment, photoresist layer 212 is removed, as shown in FIG. 2G, using the lift-off process.

Figure 2H:
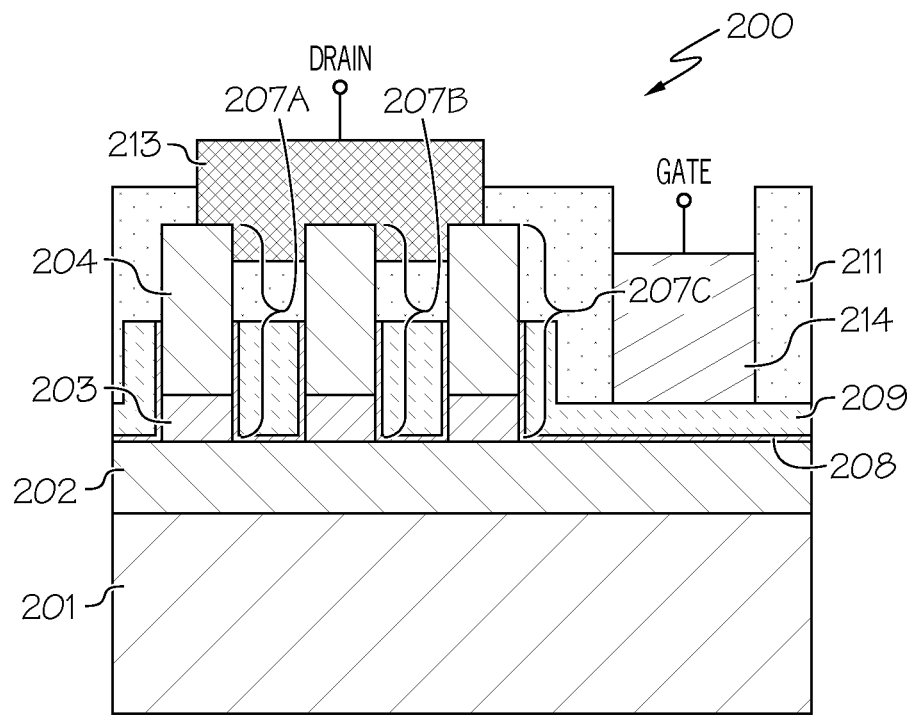
Figure 21:
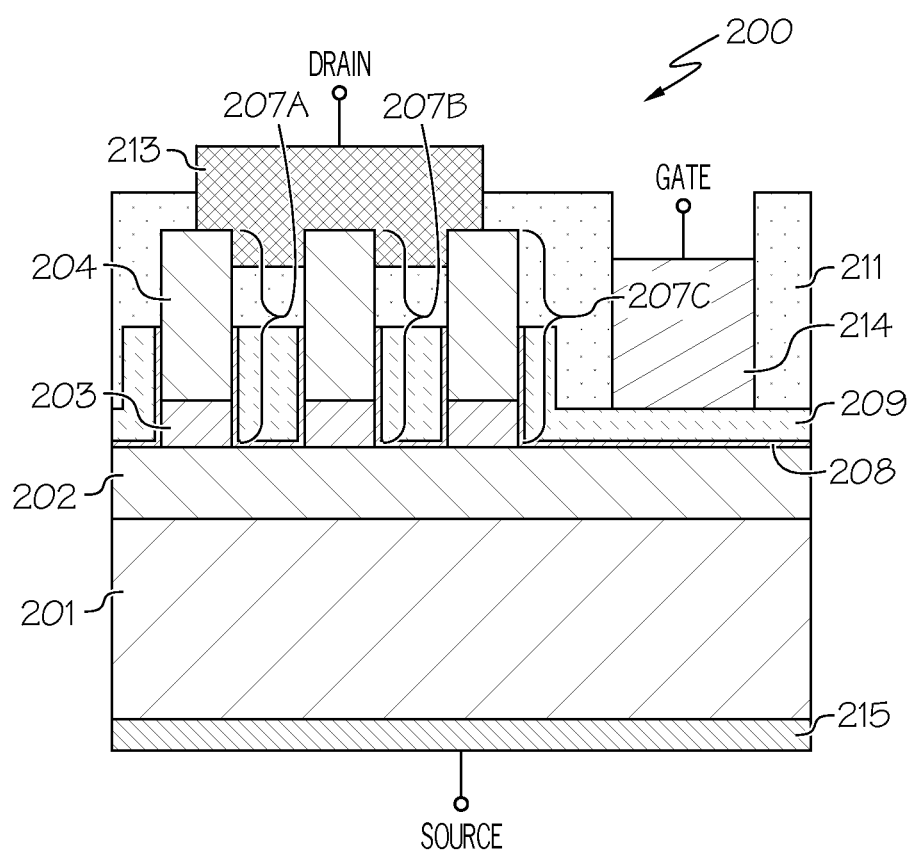

In step 115, a portion of dielectric layer 211 is patterned and etched away to form the gate contact 214 as shown in FIG. 2H. Gate contact 214 is connected to gate dielectric layer 208, which surrounds nanopillars 207 as shown in FIG. 2H.

In step 116, a source contact 215 is added to the bottom of substrate 201 as shown in FIG. 2I.

In some implementations, method 100 may include other and/or additional steps that, for clarity, are not depicted. Further, in some implementations, method 100 may be executed in a different order presented and that the order presented in the discussion of FIGS. 1A-1B is illustrative. Additionally, in some implementations, certain steps in method 100 may be executed in a substantially simultaneous manner or may be omitted.

As a result of fabricating a FET using III-V materials as opposed to silicon, the electrons possess lower effective mass and higher mobility thereby improving current drive capacity. Furthermore, since the FET of the present invention utilizes nanowires (nanopillars), such a structure (as opposed to planar devices) improves electrostatic control due to improved gate coupling which helps to reduce standby power consumption. Additionally, the vertical nanowire (nanopillar) structure of the present invention also increases the integration density. Also, as discussed above, the FET of the present invention is fabricated using nanosphere lithography which is a less costly than using the conventional photolithography process since the mask of the conventional photo lithography is no longer needed and costly convention photolithography techniques (e.g., electron beam lithography) are not used.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

The invention claimed is:

1. A method for fabricating a vertical III-V nanowire field-effect transistor, the method comprising:
   depositing a first layer of doped III-V semiconductor material on a substrate of III-V semiconductor material;
   depositing a layer of undoped III-V semiconductor material on top of said first layer of doped III-V semiconductor material;
   depositing a second layer of doped III-V semiconductor material on top of said layer of undoped III-V semiconductor material;
   growing a first dielectric layer on top of said second layer of doped III-V semiconductor material;
   depositing self-assembled monolayers of nanospheres on said first dielectric layer; and
   forming nanopillars using said nanospheres as a mask and said first dielectric layer as a hard mask to etch said second layer of doped III-V semiconductor material and said layer of undoped III-V semiconductor material using nanosphere lithography.

2. The method as recited in claim 1, wherein said first dielectric layer comprises silicon dioxide.

3. The method as recited in claim 1, wherein a diameter of said nanospheres is controlled via oxygen plasma.

4. The method as recited in claim 1 further comprising:
   dry etching said nanospheres and said first dielectric layer to remove said nanospheres and said first dielectric layer.

5. The method as recited in claim 4 further comprising:
   depositing a second dielectric layer over said nanopillars and a remaining portion of said first layer of doped III-V semiconductor material that is exposed following said dry etching.

6. The method as recited in claim 5 further comprising:
   depositing a gate metal over said second dielectric layer; and
   depositing a third dielectric layer over said gate metal.

7. The method as recited in claim 6 further comprising:
   etching said third dielectric layer to expose said gate metal; and
   etching a portion of said gate metal and a portion of said second dielectric layer to expose a top portion of said nanopillars.

8. The method as recited in claim 7 further comprising:
   removing a remaining portion of said third dielectric layer to expose a portion of said gate metal;
   depositing a fourth dielectric layer over said exposed nanopillars and said exposed gate metal; and
   depositing a photoresist layer over a portion of said fourth dielectric layer.

9. The method as recited in claim 8 further comprising:
   etching said fourth dielectric layer according to a pattern in said photoresist layer in order to form a drain contact; and
   etching a portion of said fourth dielectric layer to form a gate contact.

10. The method as recited in claim 9 further comprising;
    adding a source contact to a bottom of said substrate.

* * * * *